United States Patent [19]

Haas et al.

[11] Patent Number: 4,762,767
[45] Date of Patent: Aug. 9, 1988

[54] NEGATIVELY OPERATING PHOTORESIST COMPOSITION, WITH RADIATION-ABSORBING ADDITIVES

[75] Inventors: Günther Haas, Neckargemünd; Karl H. Neisius, Darmstadt, both of Fed. Rep. of Germany

[73] Assignee: Merck Patent Gesellschaft Mit Beschrankter Haftung, Darmstadt, Fed. Rep. of Germany

[21] Appl. No.: 857,663

[22] Filed: Apr. 30, 1986

Related U.S. Application Data

[63] Continuation-in-part of Ser. No. 628,881, Jul. 9, 1984, abandoned.

[30] Foreign Application Priority Data

Jul. 9, 1983 [DE] Fed. Rep. of Germany ....... 3324795

[51] Int. Cl.⁴ .................... G03C 1/60; G03C 1/70; G03C 1/71
[52] U.S. Cl. ..................................... 430/167; 430/196; 430/197; 430/325
[58] Field of Search ............... 430/196, 197, 183, 325, 430/330, 167

[56] References Cited

U.S. PATENT DOCUMENTS

| | | | |
|---|---|---|---|
| 2,336,309 | 12/1943 | Snell et al. | 430/183 |
| 2,528,460 | 10/1950 | Von Glahn et al. | 430/183 |
| 2,833,649 | 5/1958 | Sus et al. | 430/183 |
| 4,268,603 | 5/1981 | Sato | 430/196 |
| 4,287,289 | 9/1981 | Sato | 430/196 |
| 4,311,773 | 1/1982 | Koneko et al. | 430/325 |
| 4,349,619 | 9/1982 | Kamoshida et al. | 430/196 |
| 4,407,927 | 10/1983 | Kamoshida et al. | 430/197 |
| 4,414,314 | 11/1983 | Kaplan et al. | 430/330 |

FOREIGN PATENT DOCUMENTS 422843 1/1935 United Kingdom .

*Primary Examiner*—Charles L. Bowers, Jr.
*Attorney, Agent, or Firm*—Millen & White

[57] ABSTRACT

New aminoazobenzene derivatives of the general formula I

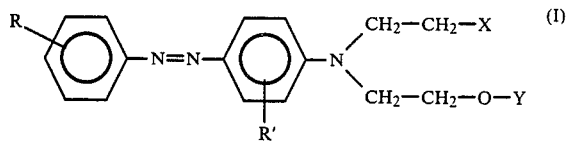

in which
R and R' independently of one another denote hydrogen, alkyl with up to 4 C atoms or halogen,
X denotes hydrogen or O—Y and
Y denotes alkyl or acyl with in each case up to 4 C atoms or optionally substituted aryl with up to 10 C atoms, are outstandingly suitable as radiation-absorbing substances in negatively operating photoresist compositions.

11 Claims, No Drawings

NEGATIVELY OPERATING PHOTORESIST COMPOSITION, WITH RADIATION-ABSORBING ADDITIVES

CROSS-REFERENCE TO RELATED APPLICATIONS

This application is a continuation-in-part of U.S. Application Ser. No. 628,881, filed on July 9, 1984, abandoned, which disclosure is incorporated by reference herein.

BACKGROUND OF THE INVENTION

Negative photoresists are at present used to a great extent in the production of electric circuits and electronic components. In particular, the structuring of the conductor or semiconductor substrates by photographic techniques in the production of highly and very highly integrated semiconductor circuits is effected with the aid of photoresists.

The customary negative photoresist compositions of today contain, as a solution in an organic solvent, cyclized rubber, as the essential component, and a photosensitive bisazido compound which acts as a photocrosslinking agent.

According to customary procedures, the substrate surfaces are coated with the photoresist composition by known methods and the solvent is removed by predrying at temperatures of about 100° C. The photoresist coating is then exposed to, in general, ultraviolet radiation imagewise through a negative mask, whereupon crosslinking of the polymer material is caused, in accordance with the image pattern, in the areas of the coating exposed to the radiation by the radiation-sensitive bisazido compound. The non-exposed parts of the coating are removed by treatment with a solvent, which serves as a developer, the insoluble areas of the image crosslinked by radiation remaining on the substrate surface as a relief structure.

The high degree of miniaturization, which is still progressing further, of electronic components produced with the aid of photoresist techniques demands an extremely high quality of the photoresist compositions used, especially in respect to the resolving power to be achieved and of the adhesion of the resist coating to the substrate.

However, negative photoresists according to the state of the art do not adequately fulfill these quality requirements. Thus, for example, when such photoresists are used on substrates which have a surface of high reflecting power, which is as a rule the case with semiconductor materials and metals, such as, for example, silicon, aluminum, copper, chromium and the like—the resolving power of the photoresists during irradiation is considerably reduced by reflection phenomena occurring on the surface of the substrate. As a result of irregular scattering of the incident light on the substrate surface, the scattered light penetrates into areas of the resist coating which, according to the image pattern of the negative mask, should not be exposed to radiation. The crosslinking of the polymer material which is also triggered off in these areas results, after development, in relief structures with an increased line width and reduced edge sharpness. Due to these effects, fine and very fine structures such as are to be produced in microelectronics can be obtained only with a limited fidelity of reproduction.

Attempts to solve the problem described are known.

Thus, for example, Japanese Auslegeschrift No. 37562/76 proposes the addition of radiation-absorbing dyestuffs, in particular 4-N,N-diethylaminoazobenzene, to photoresist compositions based on cyclized rubber and photosensitive bisazido compounds to reduce these adverse effects.

However, the compounds mentioned there as radiation absorbers have the disadvantage that they have a great tendency to sublime at temperatures up to 100° C., such as are required during predrying to achieve good adhesion of the resist coating to the substrate. The concentration of these substances in the photoresist coating is thereby reduced to such a degree that a high, reproducible resolution cannot be achieved under these conditions.

U.S. Pat. No. 4,268,603 describes negative photoresist compositions based on cyclized rubber and bisazido compounds to which a mixture of radiation-absorbing substances which emit fluorescence is added to avoid the adverse effects described. Aminoazobenzene derivatives, inter alia the compound 4-N-ethyl-N-(2-hydroxyethyl)-aminoazobenzene, are mentioned here as radiation absorbers. These photoresists of relatively complicated composition are said to ensure high fidelity of reproduction of the resist image.

It has been found, however, that the radiation absorbers used are not sufficiently soluble in the photoresist formulations in order to be present in the resist coating in an adequately effective concentration. It has furthermore been found that some of the dissolved dyestuff crystallizes out as solid substance in the coating during coating of the substrates and subsequent drying.

Such resist materials accordingly still have disadvantages in respect of current requirements.

SUMMARY OF THE INVENTION

It is thus an object of this invention to provide new radiation-absorbing substances which effectively suppress the undesirable scattering effects which occur in photoresist coatings, especially on highly reflecting substrates.

It is another object of this invention that these substances should be sufficiently soluble in negative photoresist formulations and should not volatilize out of the resist coating by evaporation or sublimation under the conditions of predrying at temperatures of about 100° C. to increase adhesion.

It is a further object of this invention that the corresponding negatively operating photoresist compositions which contain these radiation-absorbing substances fulfill the extremely high quality requirements in respect of resolving power, edge sharpness and adhesion.

Upon further study of the specification and appended claims, further objects and advantages of this invention will become apparent to those skilled in the art.

These objects have been achieved by providing the new compounds of formula I

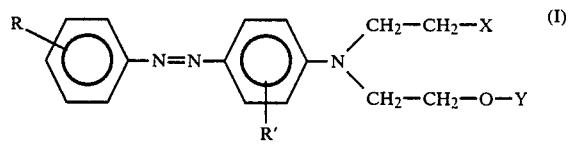

in which

R and R' independently of one another denote hydrogen, alkyl with up to 4C atoms or halogen, X denotes hydrogen or O—Y and Y denotes alkyl or acyl with in each case up to 4C atoms or optionally substituted aryl with up to 10C atoms, and their use as radiation-absorbing substances in negatively operating photoresist compositions.

Surprisingly, it has been found that, because of their good solubility, their low volatility and their absorption properties, these compounds are outstandingly suitable as radiation-absorbing additives for negatively operating photoresist compositions.

The invention thus relates to compounds of the general formula I.

The invention furthermore relates to the use of compounds of the general formula I as radiation-absorbing substances in negatively operating photoresist compositions.

The invention furthermore relates to negatively operating photoresist compositions which are based on cyclized rubber and photosensitive bisazido compounds and contain the compounds of the general formula I as radiation-absorbing substances.

DETAILED DISCUSSION

The radicals R and R' on the aromatic rings are as a rule hydrogen, but can also each be halogen, in particular chlorine and bromine, or alkyl with up to 4C atoms, such as methyl, ethyl, n- and i-propyl and n-, i- and t-butyl, and can occupy any of the ring positions which are still free. Fluorine and iodine are also possible.

As regards the radicals X and Y in the substituents on the amino nitrogen, X represents hydrogen or the grouping O—Y. Y represents one of the alkyl groups listed above with up to 4C atoms or represents an acyl (e.g., alkanoyl) group, also with up to 4C atoms, such as, for example, acetyl, propionyl, or butyryl, or represents aryl or substituted aryl with up to 10C atoms. The latter can be, for example: phenyl, alkyl-substituted phenyl, such as tolyl, or napththyl. Other suitable substituents on the aryl group for Y include halogen, preferably clorine and bromine. Generally, there are one to three substituents, preferably in the ortho and para positions of the phenyl ring. The naphthyl ring can also be substituted by halogen, e.g., chlorine or bromine. When X is also OY, each of the two Y's can be the same or different, preferably the same. Compounds in which R and R' are hydrogen, X is hydrogen or O—Y and O—Y is ethoxy, acetoxy or phenoxy are preferably used as radiation absorbers in negative photoresists.

The following compounds are particularly preferred:
4-N-ethyl-N-(2-methoxyethyl)-aminoazobenzene
4-N-ethyl-N-(2-phenoxyethyl)-aminoazobenzene
4-N,N-bis(2-ethoxyethyl)-aminoazobenzene or
4-N,N-bis(2-acetoxyethyl)-aminoazobenzene.

The compounds of the formula I are prepared in a simple manner by known methods, by diazotization of aniline and reaction of the diazonium compound with correspondingly N-substituted aniline derivatives. The N-substituted aniline derivatives are either commercially available or can easily be prepared by N-substitution of aniline.

All the compounds according to the general formula I absorb radiation in the wavelength range from 350 to 450 nm and have absorption maxima, in particular, in the range from 400 to 420 nm. On the basis of these absorption properties, these substances are particularly suitable as absorbing additives for negative photoresists in order to suppress scattering effects in resist coatings on highly reflecting substrates during structuring with ultraviolet light of this wavelength range.

Negative photoresist compositions are to be preferably understood as those which contain, as the essential component, cyclized rubber and, as photocrosslinking agents, photosensitive bisazido compounds, dissolved in an organic solvent, such as, for example, xylene. Appropriate components are adequately known and are usually employed in photoresists according to the state of the art. The class of substances described by the term cyclized rubber includes polymer materials, such as cyclized polyisoprene, cyclized isobutylene, cyclized polybutadiene and the like. Polymer materials based on cyclized polyisoprene are preferred.

The photosensitive substances used as photocrosslinking agents are preferably aromatic bisazido compounds such as are described, for example, in U.S. Pat. Nos. 2,852,379 and 2,940,853 and in German Patent Application No. 32 34 301. The compound 2,6-bis-[(4-azidophenyl)methylene]-4-methylcyclohexanone has achieved by far the greatest industrial importance and is therefore particularly preferred.

The compounds of the formula I are more than sufficiently soluble in the resist compositions containing the main components above to be present in the resist coating in an adequately effective concentration. In contrast to radiation absorbers according to the prior art, these compounds do not crystallize out during coating of the substrates or during drying.

A particular advantage of the radiation absorbers according to the invention is that they hardly volatilize at all out of the resist coating by evaporation or sublimation under the conditions of predrying at temperatures of about 100° C. Even at temperatures of 120° C. and during drying times of more than 2 hours, the concentration of the compounds according to the invention in the coating remains remarkably constant.

The predrying operation at these temperatures is therefore of particular importance, because it imparts to the resist coating an increased adhesion to the substrate. This is indispensible in the current production processes for highly miniaturized electronic circuits.

The photoresist compositions according to the invention can contain these new radiation-adsorbing substances in an amount of 0.1 to 7, preferably 0.5 to 4, percent by weight, based on the amount of cyclized rubber or other polymer.

In this concentration range, they very effectively prevent virtually any light scattering in the resist coating during irradiation of substrates coated with the photoresist materials according to the invention.

Photoresist relief structures of the highest quality in respect of resolving power, edge sharpness and adhesion can thus be obtained, even on highly reflecting substrates, by the present invention.

Details of the photoresists and their use are fully conventional unless indicated otherwise herein, e.g., as disclosed in the prior art references cited above.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE 1

Preparation of 4-N-ethyl-N-(2-phenoxyethyl)-aminoazobenzene (substance 1)

5.2 g of aniline is diazotized with 4.1 g of sodium nitrite in sulfuric acid-aqueous solution in the customary manner; the resulting diazonium salt solution is diluted with 50 ml of ethanol. This solution is added dropwise to a solution of 13.9 g of N-ethyl-N-(2-phenoxyethyl)-aniline hydrochloride in 50 ml of 50% ethanol at 5°–10° C. The pH value of the reaction mixture is then brought to 4 with 2N sodium hydroxide solution, and a further 50 ml of ethanol is added.

The mixture is stirred at 0°–5° C., the pH value falling to about 3. The mixture is brought to pH 4 again by renewed addition of 2N sodium hydroxide solution, and the product precipitated is filtered off with suction, washed with water and dried. After recrystallization from isopropanol or purification by chromatography, dark yellow crystals of m.p. 85°–86° C. are obtained.

EXAMPLE 2

Preparation of 4-N-ethyl-N-(2-methoxyethyl)-aminoazobenzene (substance 2)

9.3 g of aniline is diazotized with 8.0 g of sodium nitrite in sulfuric acid-aqueous solution in the customary manner; the resulting diazonium salt solution is diluted with 75 ml of ethanol. This solution is added dropwise to a solution of 18.1 g of N-ethyl-N-(2-methoxyethyl)-aniline hydrochloride in 75 ml of 50% ethanol at 5°–10° C. The pH value of the reaction mixture is then brought to 4 with 2N sodium hydroxide solution, and a further 75 ml of ethanol is added.

The mixture is stirred at 0°–5° C., the pH value falling to about 3. The mixture is brought to pH 4 again by renewed addition of 2N sodium hydroxide solution, and the product precipitated is filtered off with suction, washed with water and dried. After recrystallization from isopropanol or purification by chromatography, dark yellow crystals are obtained.

The following compounds are prepared analogously:
4-N,N-bis(2-ethoxyethyl)-aminoazobenzene (substance 3)
4-N,N-bis(2-acetoxyethyl)-aminoazobenzene (substance 4).

EXAMPLE 3

Determination of the tendency towards sublimation

In each case 10 g of cyclized polyisoprene is dissolved in 90 g of xylene and in each case 0.3 g of substance 1, 2, 3 or 4-N,N-diethylaminoazobenzene (comparison substance 5) is added. Quartz discs are each coated with the solutions thus obtained.

No comparable resist formulation can be produced with 4-N-ethyl-N-(2-hydroxyethyl)-aminoazobenzene (comparison substance 6), since about 0.1 g of undissolved substance remains after filtration of the resist solution.

The extinction values in the particular absorption maxima (408–412 nm), measured after various drying times at elevated temperatures and in percent in comparison with the starting value, serve as a measure of the tendency of the absorber substances contained in the resist coating to sublime.

| Drying conditions | Extinction of the resist coating, containing substance | | | |
|---|---|---|---|---|
| | 1 | 3 | 4 | 5 |
| 80° C., 30 minutes | 100% | 100% | 100% | 95% |
| 80° C., 150 minutes | 100% | 100% | 100% | 75% |
| 100° C., 30 minutes | 100% | 100% | 98% | 90% |
| 100° C., 150 minutes | 100% | 95% | 90% | 60% |
| 120° C., 30 minutes | 100% | 95% | 95% | 81% |
| 120° C., 150 minutes | 100% | 85% | 78% | 50% |

EXAMPLE 4

Production of negative relief images

Silicon wafers which have first been provided with a 0.2 μm thick aluminum coating on the surface are each coated with a photosensitive composition of in each case 10 g of cyclized polyisoprene, 90 g of xylene, 0.4 g of 2,6-bis-[(4-azidophenyl)methylene]-4-methylcyclohexanone and (A) 0.3 g of substance 1,
(B) 0.3 g of substance 3,
(C) 0.3 g of substance 4,
(D) 0.3 g of comparison substance 5 or
(E) 0.3 g of comparison substance 6+.

+After filtration of the resist solution, about 0.1 g of undissolved substance remains in solid deposits in the coating; cannot be used.

After drying (20 minutes, 100° C.), the resulting photosensitive coatings (coating thickness 1 μm) are exposed imagewise through a resolution test mask of chromium. Development is effected by treatment with a commercially available developer solution for 50 seconds.

| Photosensitive composition | Resolving power | Adhesion |
|---|---|---|
| A | 1.8 μm | good |
| B | 2.1 μm | good |
| C | 2.0 μm | good |
| D | 2.6 μm | moderate (drying at 85° C.) |
| E | ./.++ | good |

The preceding examples can be repeated with similar success by substituting the generically or specifically described reactants and/or operating conditions of this invention for those used in the preceding examples. From the foregoing description, one skilled in the art can easily ascertain the essential characteristics of this invention and, without departing from the spirit and scope thereof, can make various changes and modifications of the invention to adapt it to various usages and conditions.

What is claimed is:
1. In a negatively operating photoresist composition consisting essentially of a photoresist polymer which is a cyclized rubber and a photosensitive crosslinking agent which is an aromatic bisazido compound, the improvement wherein the composition further consists essentially of an amount effective as a radiation-absorbing substance of a compound of the formula

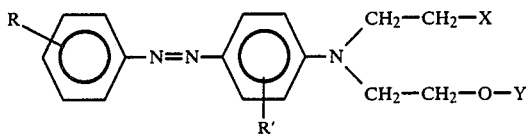

wherein
- R and R' independently are hydrogen, alkyl of up to 4C atoms or halogen,
- X is hydrogen or O—Y and
- Y is alkyl or alkanoyl in each case of up to 4C atoms, phenyl, phenyl substituted by $C_{1-4}$-alkyl or napthyl.

2. A composition of claim 1, wherein the bisazido compound is 2,6-bis-[(4-azido-phenyl)methylene]-4-methylcyclohexanone.

3. A composition of claim 1, wherein the amount of said radiation-absorbing substance is about 0.1 to 7 wt % based on the amount of cyclized rubber.

4. A composition of claim 1, wherein R and R' are both H.

5. A composition of claim 1, wherein X is H.

6. A composition of claim 1, wherein Y is methyl, ethyl, acetyl or phenyl.

7. A composition of claim 1, wherein 4-N-ethyl-N-(2-phenoxyethyl)-aminoazobenzene, 4-N,N-bis(2-ethoxyethyl)-aminoazobenzene or 4-N,N-bis(2-acetoxyethyl)aminoazobenzene is the radiation absorbing substance.

8. A composition of claim 1, wherein 4-N-ethyl-N-(2-methoxyethyl)-aminoazobenzene is the radiation absorbing substance.

9. An article comprising a negative photoresist composition according to claim 1 applied to the surface of a substrate having high reflecting power.

10. An article according to claim 9, wherein said substrate is silicon, aluminum, copper or chromium.

11. A composition of claim 3, wherein said amount is 0.5–4 wt %.

* * * * *